(12) United States Patent
Smith

(10) Patent No.: US 8,852,850 B2
(45) Date of Patent: Oct. 7, 2014

(54) METHOD OF PHOTOLITHOGRAPHY USING A FLUID AND A SYSTEM THEREOF

(75) Inventor: Bruce W. Smith, Webster, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 11/049,796

(22) Filed: Feb. 3, 2005

(65) Prior Publication Data

US 2005/0270505 A1  Dec. 8, 2005

Related U.S. Application Data

(60) Provisional application No. 60/541,349, filed on Feb. 3, 2004.

(51) Int. Cl.
*G03F 7/00* (2006.01)
*G03B 27/42* (2006.01)
*G03F 7/20* (2006.01)

(52) U.S. Cl.
CPC .............. *G03F 7/2041* (2013.01); *G03B 27/42* (2013.01); *G03F 7/70341* (2013.01)
USPC .............. 430/311; 252/588; 252/582; 355/30

(58) Field of Classification Search
USPC ................................................ 252/582, 588
See application file for complete search history.

(56) References Cited

U.S. PATENT DOCUMENTS

| | | | | |
|---|---|---|---|---|
| 4,480,910 A | | 11/1984 | Takanashi et al. | |
| 4,493,533 A | * | 1/1985 | Petrzilka et al. | 252/408.1 |
| 4,509,852 A | * | 4/1985 | Tabarelli et al. | 355/30 |
| 5,900,354 A | * | 5/1999 | Batchelder | 430/395 |
| 7,145,641 B2 | * | 12/2006 | Kroon et al. | 355/71 |
| 2005/0161644 A1 | * | 7/2005 | Zhang et al. | 252/582 |
| 2005/0164502 A1 | * | 7/2005 | Deng et al. | 438/689 |

OTHER PUBLICATIONS

Smith et al., "Approaching the Numerical Aperture of Water—Immersion Lithography at 193nm," *Proceedings of SPIE* 5377:273-284 (2004).

Zhou et al., "High Refractive Index Liquid for Immersion Lithography," *Rochester Institute of Technology*, Microelectronic Engineering Department (unpublished).

Smith et al., "Approaching the NA of Water: Immersion Lithography at 193nm," Slide Presentation (date unknown).

\* cited by examiner

*Primary Examiner* — Daborah Chacko Davis

(74) *Attorney, Agent, or Firm* — Joseph M. Noto; Bond Schoeneck & King PLLC

(57) ABSTRACT

A photolithographic exposure system for use on a photoresist on a substrate includes an illumination system, a photomask with one or more object patterns, a projection optical exposure system, and a fluid dispensing system. The projection optical exposure system is positioned to project an image of the one or more object patterns toward an image plane. The fluid dispensing system positions a fluid between the projection optical exposure system and the photoresist on the substrate. The fluid has a refractive index value above a refractive index value of water and an absorbance below 0.8 per millimeter at wavelengths between about 180 nm and about 300 nm.

40 Claims, 10 Drawing Sheets

THE ITRS LITHOGRAPHY TECHNOLOGY LITHOGRAPHY RESOLUTION
REQUIREMENTS FOR SEMICONDUCTOR DEVICES.

| YEAR OF PRODUCTION | 2003 | 2004 | 2005 | 2006 | 2007 | 2010 | 2013 | 2016 |
|---|---|---|---|---|---|---|---|---|
| DRAM (MEMORY DEVICES) | | | | | | | | |
| DRAM 1/2 PITCH (nm) | 100 | 90 | 80 | 70 | 65 | 45 | 32 | 22 |
| CONTACT (nm) | 130 | 110 | 100 | 90 | 80 | 55 | 40 | 30 |
| MPU (MICROPROCESSORS) | | | | | | | | |
| MPU 1/2 PITCH (nm) | 107 | 90 | 80 | 70 | 65 | 45 | 32 | 22 |
| MPU GATE (nm) | 65 | 53 | 45 | 40 | 35 | 25 | 18 | 13 |
| CONTACT (nm) | 122 | 100 | 90 | 80 | 75 | 50 | 37 | 27 |

*FIG. 1*

ABSORBANCE OF VARIOUS INORGANIC AQUEOUS SOLUTIONS AT 193 nm AND 248 nm.

| FLUIDS | ONSET WAVELENGTH $\lambda_0$ (nm) | ABSORBANCE $\alpha$ (mm$^{-1}$) | |
|---|---|---|---|
| | | @193nm | @248nm |
| $AlCl_3 \cdot 6H_2O$@50% | 209 | - | 0.010 |
| HCl@20% | 210 | - | 0.002 |
| $CaCl_2$@20% | 209 | - | 0.026 |
| CsCl@20% | 206 | - | 0.002 |
| CsI@20% | - | - | - |
| KCl@20% | 209 | - | 0.003 |
| $ZnBr_2$@20% | 234 | - | 0.013 |
| $Zn(NO_3)_2$@40% | - | - | - |
| $NaH_2PO_4$@16% | 196 | 0.429 | 0.110 |
| $Na_2HPO_4$@16% | 208 | - | 0.015 |
| $KH_2PO_4$@16% | 196 | 0.571 | 0.163 |
| $H_3PO_4$@20% | 192 | 0.025 | 0.002 |
| $AlK(SO_4)_2 \cdot 12H_2O$@20% | 197 | 0.286 | 0.005 |
| $AlNH_4(SO_4)_2 \cdot 12H_2O$(SATURATED) | 198 | 0.515 | 0.002 |
| $H_2SO_4$@20% | 197 | 0.246 | 0.002 |
| $Li_2SO_4$@17% | 228 | - | 0.009 |
| $Na_2SO_4$@17% | 199 | - | 0.001 |
| $K_2SO_4$@8% | 199 | - | 0.001 |
| $RbSO_4$@25% | 230 | - | 0.023 |
| $CsSO_4$@40% | 199 | 0.706 | 0.002 |
| $MgSO_4$@5% | 196 | - | 0 |
| $Gd_2(SO_4)_3$@1.5% | 195 | 0.092 | 0 |
| $ZnSO_4$@40% | 201 | - | 0.003 |

*FIG. 7*

FLUID REFRACTIVE INDICES AND CAUCHY PARAMETERS.

| FLUIDS | REFRACTIVE INDICES | | CAUCHY PARAMETERS | | |
| --- | --- | --- | --- | --- | --- |
|  | @193nm | @248nm | A | B ($10^{-3}$) | C ($10^{-4}$) |
| $AlCl_3 \cdot 6H_2O$ @50% | 1.584 | 1.489 | 1.4101 | 2.4 | 1.52 |
| HCl@37% | 1.583 | 1.487 | 1.3997 | 3.2 | 1.34 |
| CsCl@60% | 1.561 | 1.466 | 1.3912 | 2.0 | 1.60 |
| $H_3PO_4$@20% | 1.452 | 1.398 | 1.3486 | 1.8 | 0.77 |
| $H_3PO_4$@40% | 1.475 | 1.420 | 1.3723 | 1.5 | 0.85 |
| $H_3PO_4$@85% | 1.538 | 1.488 | 1.4316 | 2.8 | 0.42 |
| $AlK(SO_4)_2 \cdot 12H_2O$@20% | 1.452 | 1.399 | 1.3468 | 2.1 | 0.69 |
| $AlNH_4(SO_4)_2 \cdot 12H_2O$(SATURATED) | 1.437 | 1.384 | 1.3329 | 2.0 | 0.71 |
| $H_2SO_4$@20% | 1.472 | 1.418 | 1.3635 | 2.2 | 0.68 |
| $H_2SO_4$@96% | 1.516 | 1.469 | 1.4151 | 2.7 | 0.40 |
| $Li_2SO_4$@16% | 1.456 | 1.403 | 1.35 | 2.2 | 0.64 |
| $Na_2SO_4$@30% | 1.479 | 1.423 | 1.3667 | 2.3 | 0.69 |
| $NaHSO_4$@44% | 1.473 | 1.418 | 1.3643 | 2.1 | 0.74 |
| $RbSO_4$@25% | 1.456 | 1.402 | 1.35 | 2.1 | 0.70 |
| $CsSO_4$@40% | 1.481 | 1.422 | 1.3685 | 2.0 | 0.83 |
| $ZnSO_4$@40% | 1.482 | 1.424 | 1.3678 | 2.2 | 0.75 |
| $H_2O$(DI) | 1.436 | 1.379 | 1.3283 | 2.1 | 0.67 |

*FIG. 9*

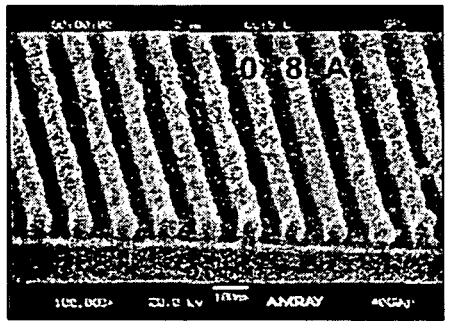
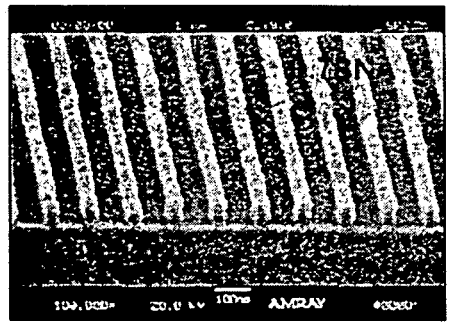
59nm 1:1 (50nm RESIST)     59nm 1:2 (50nm RESIST)
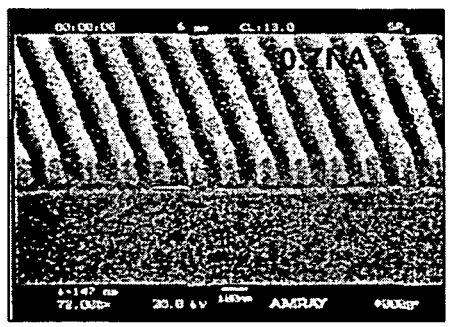
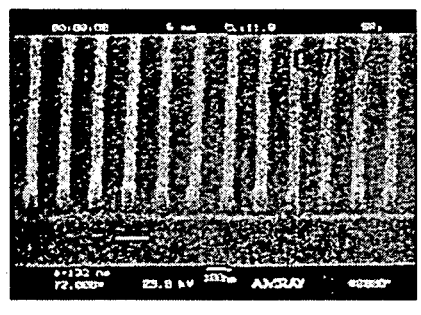
59nm 1:1 (50nm RESIST)     59nm 1:2 (50nm RESIST)
COMPARISON OF RESIST IMAGES USING CESIUM SULFATE SOLUTION (TOP) AND WATER (BOTTOM) IMMERSION FLUIDS. THE NUMERICAL APERTURE VALUES OF 0.78 (SULFATE) AND 0.70 (WATER) ARE A RESULT OF IDENTICAL ANGLES IN THE IMMERSION FLUIDS (31°).
*FIG. 10*

METHOD OF PHOTOLITHOGRAPHY USING A FLUID AND A SYSTEM THEREOF

This application claims the benefit of U.S. Provisional Patent Application Ser. No. 60/541,349, filed Feb. 3, 2004, which is hereby incorporated by reference in its entirety.

FIELD OF THE INVENTION

The present invention generally relates to methods and systems for lithography and, more particularly, to a method and system for lithography using a fluid with a high refractive index value and a low absorption.

BACKGROUND

Optical lithography involves the creation of relief image patterns through the projection of radiation within or near the ultraviolet (UV) visible portion of the electromagnetic spectrum. Techniques of optical microlithography have been used for decades in the making of microcircuit patterns for semiconductor devices. Early techniques of contact or proximity photolithography were refined to allow circuit resolution on the order of 3 to 5 µm. More modern projection techniques minimize some of the problems encountered with proximity lithography and have lead to the development of tools that currently allow resolution below 0.15 µm.

Semiconductor device features are generally on the order of the wavelength of the UV radiation used to pattern them. Currently, exposure wavelengths are on the order of 150 to 450 nm and more specifically 157 nm, 293 nm, 248 nm, 365 nm, and 436 nm. The most challenging lithographic features are those which fall near or below sizes corresponding to 0.35 $\lambda$/NA, where $\lambda$ is the exposing wavelength and NA is the objective lens numerical aperture of the exposure tool. As an example, for a 193 nm wavelength exposure system incorporating a 0.75 NA objective lens, the imaging of features at or below 90 nanometers is considered state of the art.

The feature size is proportional to the illumination wavelength and inversely proportional to the numerical aperture (NA) of the lithography system. The absolute limitation to the smallest feature that can be imaged in any optical system corresponds to 0.25 $\lambda$/NA. Furthermore, the depth of focus (DOF) for such an exposure tool can be defined as $+/-k_2 \lambda/NA^2$ where $k_2$ is a process factor that generally takes on a value near 0.5

Optical lithography has been driven toward sub-100 nm dimensions using techniques such as high NA, phase-shift masking, modified illumination, optical proximity correction, and pupil filtering are being employed. Fabrication challenges have been aggressively pursued so that 70 nm device geometry may be possible using wavelengths as large as 193 nm. Lithography at 157 nm is positioned for 50-70 nm technology, extending optical methods yet further along the semiconductor technology roadmap. Though the shorter wavelength of 157 nm is beneficial, additional resolution enhancement is needed to ensure that this technology is viable or is multi-generational. The problems with such a short wavelength have introduced associated risks.

If numerical aperture (NA) values above 1.0 were possible by imaging into a media with a refractive index greater than 1.0, sub-quarter wavelength lithography could be obtained. Such large numerical apertures have been demonstrated using immersion methods for microscopy and more recently for lithographic applications. Exploiting this potential at 157 nm has been shown by imaging into perfluoropolyethers, but these fluids are generally too absorbing to allow for application to manufacturing.

The choice of an immersion fluid is based primarily on its transparency. As wavelengths are increased from the vacuum ultraviolet (VUV), liquids with more attractive properties have sufficient transmission for use as immersion imaging fluids. The prime example is water, with absorption below 0.50 cm−1 at 185 nm and below 0.05 cm−1 at 193 nm. The refractive index of water at 193 nm is 1.44, which effectively decreases wavelength to 134 nm. The resolution is proportionally increased by the refractive index value. This represents a 43% potential improvement in resolution, which is twice that achieved with the wavelength transitions from 248 nm to 193 nm, from 193 nm to 157 nm, or from 157 nm to 126 nm. DOF for immersion imaging is calculated based on the effective reduction in wavelength, or $\lambda/(nNA^2)$. This is significant as the usable focal depth scales linearly with the media index rather than quadradically with the media NA.

Immersion lithography has been explored in the past, as disclosed in U.S. Pat. Nos. 4,480,910 and 4,509,852 which are both herein incorporated by reference in their entirety, with little success for several reasons including, UV resists used for wavelengths above 300 nm release a significant volume of dissociated nitrogen through photochemical reaction upon exposure. Additionally, the relatively high index fluids at UV wavelengths above 300 nm tend to react with photoresist materials. Further, standard immersion fluids used in microscopy are not transparent below 300 nm. Also, alternative microlithography solutions existed. Furthermore, the refractive index of water at UV wavelengths above 300 nm is not sufficiently high (~1.30) to warrant its use so that the above concerns could be alleviated.

The current situation for deep ultraviolet/vacuum ultraviolet (DUV)/VUV lithography is quite different. Optical lithography is approaching the limits of wavelength, resolution, and conventional numerical aperture. Exploration into imaging methods that were previously considered impractical have become reasonable. The use of water as an immersion fluid is now an attractive choice for several reasons that are contrary to the problems in the past. For example, 193 nm and 248 nm resist platforms release low volumes of gas during exposure. Additionally, the reaction of water with 193 nm and 248 nm photoresists is minimal and can be reduced to immeasurable levels through modification of pH. Further, water is transparent to below 0.05 cm−1 at 193 nm and water is an existing component of wafer processing, limiting the critical concerns of wetting, cleaning and drying. Also, few alternative optical choices now exist. Although water can be utilized as an immersion fluid at wavelengths between 180 and 300 nm, it is limited to refractive index at wavelengths between 1.40 and 1.45. Larger immersion fluid refractive index values would be preferred.

Predictions of the International Technology Roadmap for Semiconductors (ITRS) for future lithography requirements are in a table shown in FIG. 1. The recent interest in immersion lithography is allowing for significant progress along this roadmap. This is made possible by enhancing the effective numerical aperture of optical lithography systems. If numerical aperture values above 1.0 are made possible using immersion imaging, resolution to 32 nm could be obtained. By extending the usability of UV wavelengths, the materials and availability issues associated with shorter vacuum-UV (VUV) wavelengths are relaxed. Immersion lithography is being established as the most effective way to push UV and VUV lithography into additional device generations. The critical research involved can be very economical and the technology represents relatively small changes in the optical tooling requirements.

SUMMARY

A photolithographic exposure system for use on a photoresist on a substrate in accordance with embodiments of the present invention includes an illumination system, a photomask with one or more object patterns, a projection optical exposure system, and a fluid dispensing system. The projection optical exposure system is positioned to project an image of the one or more object patterns toward an image plane. The fluid dispensing system positions a fluid between the projection optical exposure system and the photoresist on the substrate. The fluid has a refractive index value above a refractive index value of water and an absorbance below 0.8 per millimeter at wavelengths between about 180 nm and about 300 nm.

A method for photolithographic exposure in accordance with embodiments of the present invention includes placing a fluid on a photoresist on a substrate. The fluid has a refractive index value above a refractive index value of water and an absorbance below 0.8 per millimeter at wavelengths between about 180 nm and about 300 nm. Illumination is directed through a photomask with one or more object patterns to project the one or more object patterns on the photoresist.

A system for making an immersion fluid for lithography in accordance with embodiments of the present invention includes a water purification system and an injection system. The water purification system removes at least one of one or more contaminants and one or more gasses from a liquid. The injection system adds at least one additive to the liquid to raise a refractive index of a fluid comprising the liquid and the at least one additive to a first value above a refractive index value of water.

A method for making an immersion fluid for lithography in accordance with embodiments of the present invention includes removing at least one of one or more contaminants and one or more gasses from a liquid. At least one additive is added to the liquid to raise a refractive index of a fluid comprising the liquid and the at least one additive to a first value above a refractive index value of water.

The present invention provides fluids for use in immersion lithography which do not increase absorption beyond levels which can be tolerated in a lithography process while increasing the refractive index of the fluid above that for water alone. With these fluids smaller features with greater resolution can be imaged in photoresist.

BRIEF DESCRIPTION OF THE DRAWINGS

FIG. 1 is a table of predictions of future lithography requirements;

FIG. 7 is a table of absorbance of a plurality of fluids at 193 nm and 248 nm;

FIG. 9 is a table of fluid refractive indices and Cauchy parameters; and

FIG. 10 are pictures of imaging of photoresist with different features sizes and with different thicknesses of photoresist.

DETAILED DESCRIPTION

Figure 2:
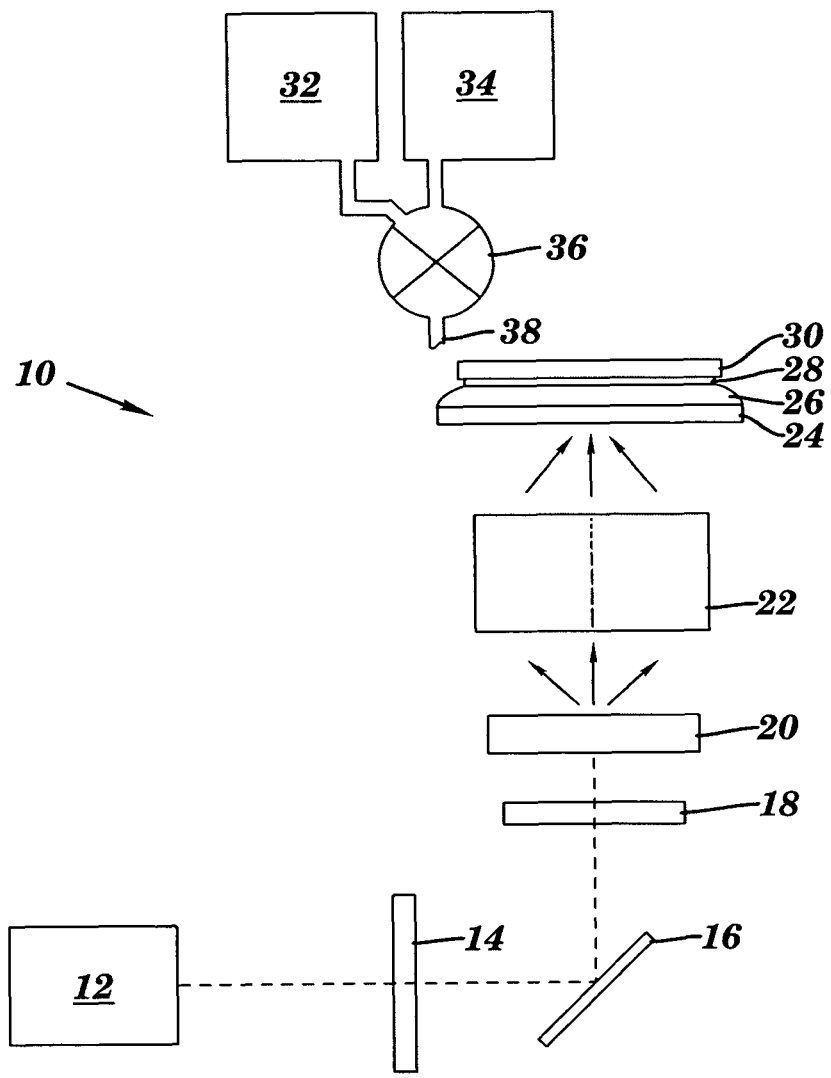
FIG. 2 is a block diagram of a system for lithography using an immersion fluid in accordance with embodiments of the present invention.

A system 10 for lithography of a photoresist 28 on a substrate 30 using a fluid 26 with a refractive index value above a refractive index value of water and an absorbance below 0.8 per millimeter at wavelengths between about 180 nm and about 300 nm in accordance with embodiments of the present invention is illustrated in FIG. 2. The system 10 includes an illumination system 12, lens system 14, mirror 16, lens system 18, photolithographic mask 20, objective lens system 22, and transparent support system 24, although system 10 can include other types and numbers of components connected in other manners and the fluid 26 can be used with other types of lithography systems, such as an interferometric immersion lithography system. The present invention provides fluids for use in immersion lithography which do not increase absorption beyond levels which can be tolerated in a lithography process while increasing the refractive index of the fluid above that for water alone. With these fluids smaller features with greater resolution can be imaged in photoresist.

Referring more specifically to FIG. 2, the system 10 includes an illumination source 12 which provides the radiation, such as UV or vacuum ultraviolet (VUV), used for the lithographic imaging, although other types of radiation sources and other types of radiation can be used. The emitted radiation is guided through the system 10 by lens system 14, mirror 16, and lens system 18, although the emitted radiation can be guided through the system 10 in other manners with other numbers and types of components. Since the lenses and other components typically found in lens systems 14 and 18 are well known to those of ordinary skill in the art, they will not be described here.

The photolithographic mask 20 is positioned in the path of the emitted radiation from the lens system 18, although the mask 20 can be positioned in other manners. The mask 20 includes a plurality of object patterns to be imaged on the photoresist 28 on the substrate 30, although the mask 20 can have other numbers of object patterns. An objective lens system 22 is positioned in the path of the emitted radiation which has passed through the mask 20 and is positioned to direct the radiation with the object patterns towards the transparent support system 24. The transparent support system 24 is a semi-circular lens which supports the fluid 26 and permits the radiation with the object patterns into the fluid 26, although other types of support systems could be used.

The fluid 26 is positioned between the transparent support system 24 and the photoresist 28, although other arrangements for positioning the fluid 26 can be used. By way of example only, the fluid 26 could be positioned between the photoresist 28 and the objective lens system 22 or the fluid 26 could be positioned in other locations in other types of immersion lithography systems.

The resolution of an objective is a function of the angular aperture (□). When combined with refractive index (n), the product:

$$n(\sin(\theta))$$

is known as the numerical aperture (abbreviated NA), and provides a convenient indicator of the resolution for any particular objective. The refractive index of the imaging medium, such as fluid 26, is critical in determining the working numerical aperture of the system 10. An increase in numerical aperture is observed when the objective lens of the system 10 is designed to operate with the fluid 26 with an increased refractive index value. The fluid 26 has a refractive index value above a refractive index value of water, in these embodiments above about 1.5, and an absorbance below 0.8 per millimeter at wavelengths between about 180 nm and about 300 nm, although other thresholds than a refractive index value of 1.5 and 0.8 per millimeter at wavelengths. By way of example, the refractive index of water at 193 nm is about 1.436 and the refractive index of water at 248 nm is about 1.379. To further increase NA and reduce reflection at the interface between the fluid 26 and the photoresist 28 the fluid should have a refractive index value close to the refractive index value of the photoresist 28.

The photoresist 28 is deposited on the substrate 30. The formulation of the photoresist 28 can be controlled to reduce interactions of the photoresist 28 with the fluid 26 by modifying the size, types, and amounts of photo-acid generator, photobase, and polymer compounds to limit reaction with the fluid 26.

A liquid source and purification system 32 substantially removes containments and gases from the water, although other liquids could be used. The additive source 34 has one or more additives, such as anions of Br—, Cl—, F—, OH—, I—, ClO4-1, HPO42-1, SO42-1, H2PO4-, and HSO4- or cations of H+, Cs+, Rb+, K+, Li+, Na+, NH4+, H3+O, and other rare earth (refractory metal) elements of the periodic table in groups 1A through VIIIA, which can be added to the liquid to form the fluid, although the additive source can add other numbers and types of additives. The liquid with the additive forms the fluid 26 with a refractive index value above the refractive index value of water and an absorbance below 0.8 per millimeter at wavelengths between about 180 nm and about 300 nm.

A mixing system 36 is used to mix the purified liquid from the liquid source and purification system 32 with the additive from the additive source 34, although other manners of creating the fluid 26, such as an injection system that injects the additive into the liquid can be used. The mixing system 36 includes an adjustable nozzle 38 which can be position adjacent one surface of lens system 24, although other manners for positioning the fluid can be used for immersion lithography.

The operation of the system 10 will now be described with reference to FIG. 1. Radiation emitted from the illumination source 12 passes through lens systems 14, is reflected off of mirror 16, and passes through lens system 18 on to the photolithographic mask 20. The radiation passes through the mask 20 and into the objective lens system 22 with the object patterns. The radiation with the object patterns from the objective lens system 22 passes through transparent support system 24 into the fluid 26 and onto the photoresist 28. This radiation images the object patterns from the mask 20 into the photoresist 28. With the fluid 26, smaller features with greater resolution can be achieved. The properties and operation of the fluid 26 in lithography applications will be discussed in greater detail below.

Figure 3:
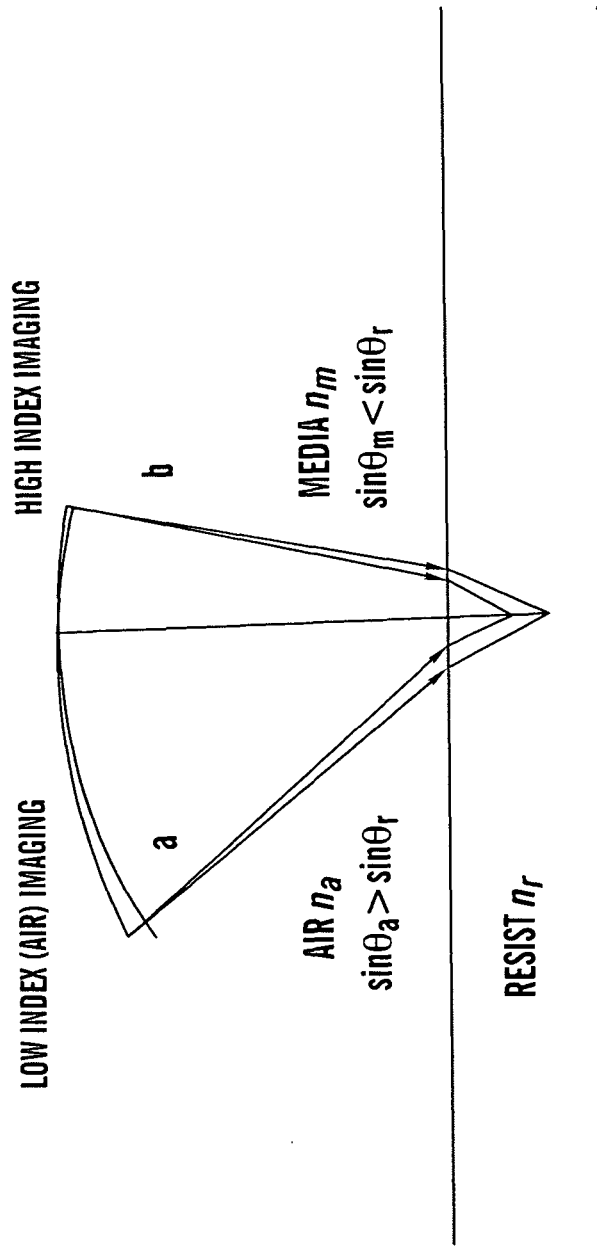
FIG. 3 is a diagram of low index imaging of a photoresist with air and of high index imaging of the photoresist with another media.
Figure 4:
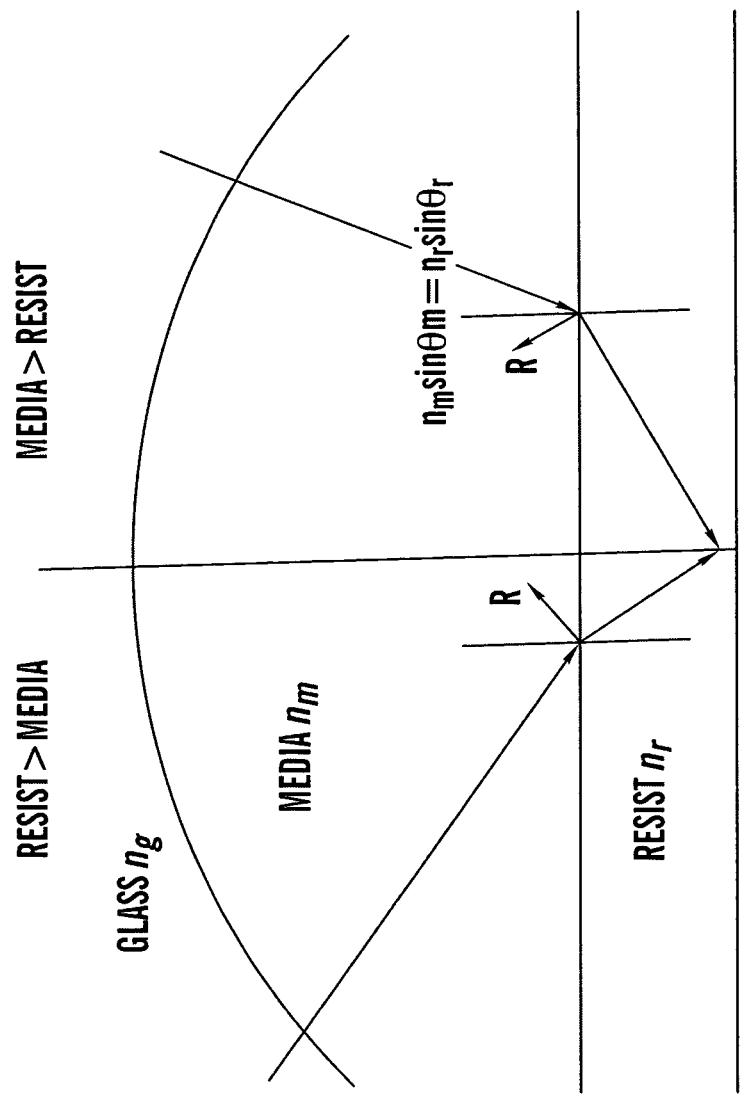
FIG. 4 is another diagram of imaging of a photoresist with a media.

Referring to FIG. 3, imaging on to the photoresist 28 through air and another media with system 10 or another lithography system is illustrated The left portion of this figure depicts an optical wavefront created by a projection imaging system, such as the one disclosed in system 10, which is focused through an imaging media into the photoresist 28. The imaging media in this example is air and has a refractive index value of $n_a$ and the photoresist has a refractive index nm. The right portion of the figure depicts an optical wavefront focused through a media of refractive index larger than the one on the left, specifically nm into the photoresist 28. As the refractive index $n_m$ increases, the effects of defocus, where an image is focused at a position in the photoresist 28 removed from the initial focus and is blurred as a result, is reduced. As shown in FIG. 4, a refractive index approaching that of the photoresist 28 is desirable to allow for reduced reflection at interfaces between media and the photoresist 28 and to allow for large angles into the photoresist 28, resulting in greater capacity for high resolution.

The present invention provides a method and system for adjusting the refractive index of the fluid 26 to a value that has been designed for the lithography system 10. In these embodiments, the fluid 26 comprises water with one or more additives, although other types of liquids can be used. The refractive index of water can be increased from its natural value through the addition of one or more additives or compounds which introduce acceptably low absorption to the fluid 26.

In general, the ultraviolet and visible absorption of a material involves the excitation of an electron from the ground state to an excited state. When solvents are associated with the material, additional "charge-transfer-to-solvent" transitions (CTTS) are provided. The absorption wavelength (the wavelength of maximum absorption) resulting from CTTS properties and absorption behavior of aqueous solutions of halide ions follow the behavior:

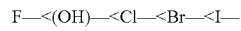

F—<(OH)—<Cl—<Br—<I—

Where fluoride ions absorb at shorter wavelengths than iodide. Furthermore, alkalai metal cations can shift the maximum absorbance wavelength to lower values, following the following behavior:

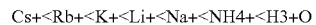

Cs+<Rb+<K+<Li+<Na+<NH4+<H3+O

Furthermore, the change in the absorption with temperature is positive and small (~500 ppm/° C.), while the change with pressure is negative and small.

Figure 5:
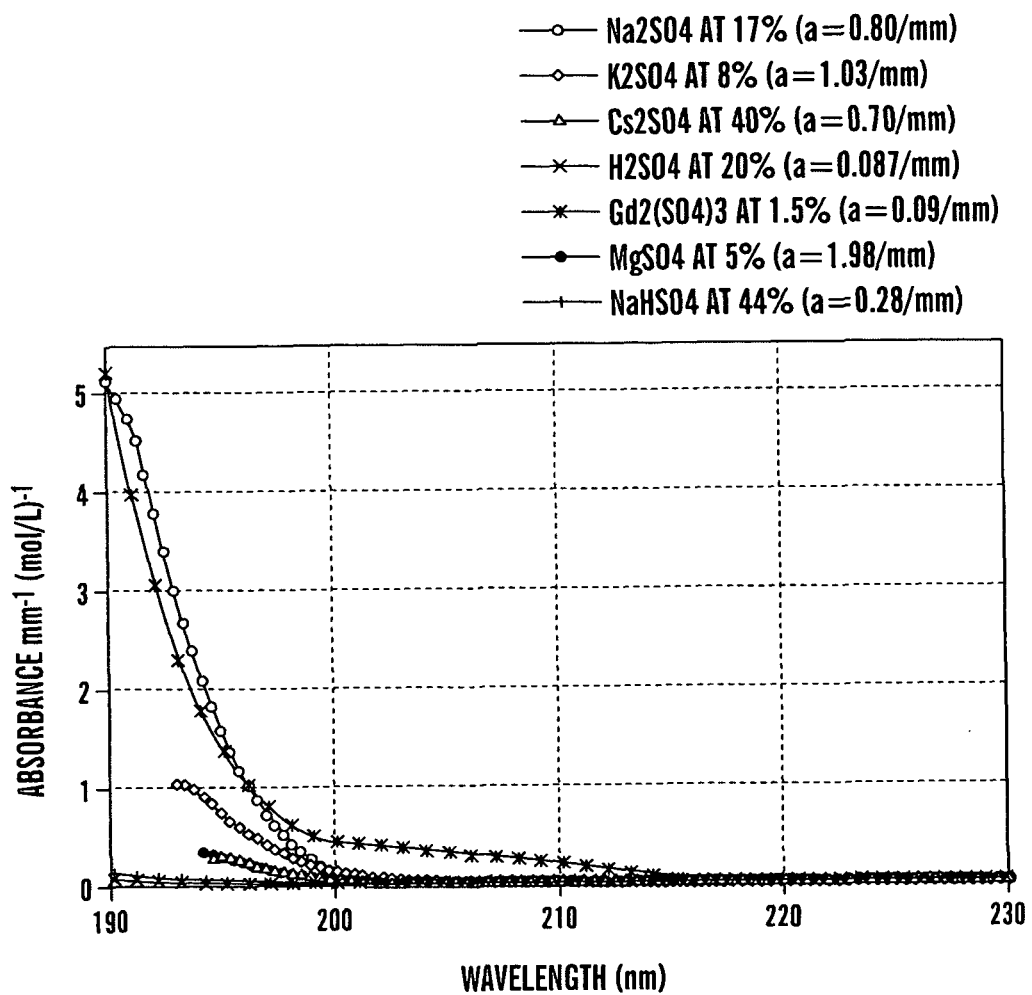
FIG. 5 is a graph of absorbance versus wavelength for a plurality of fluids.
Figure 6:
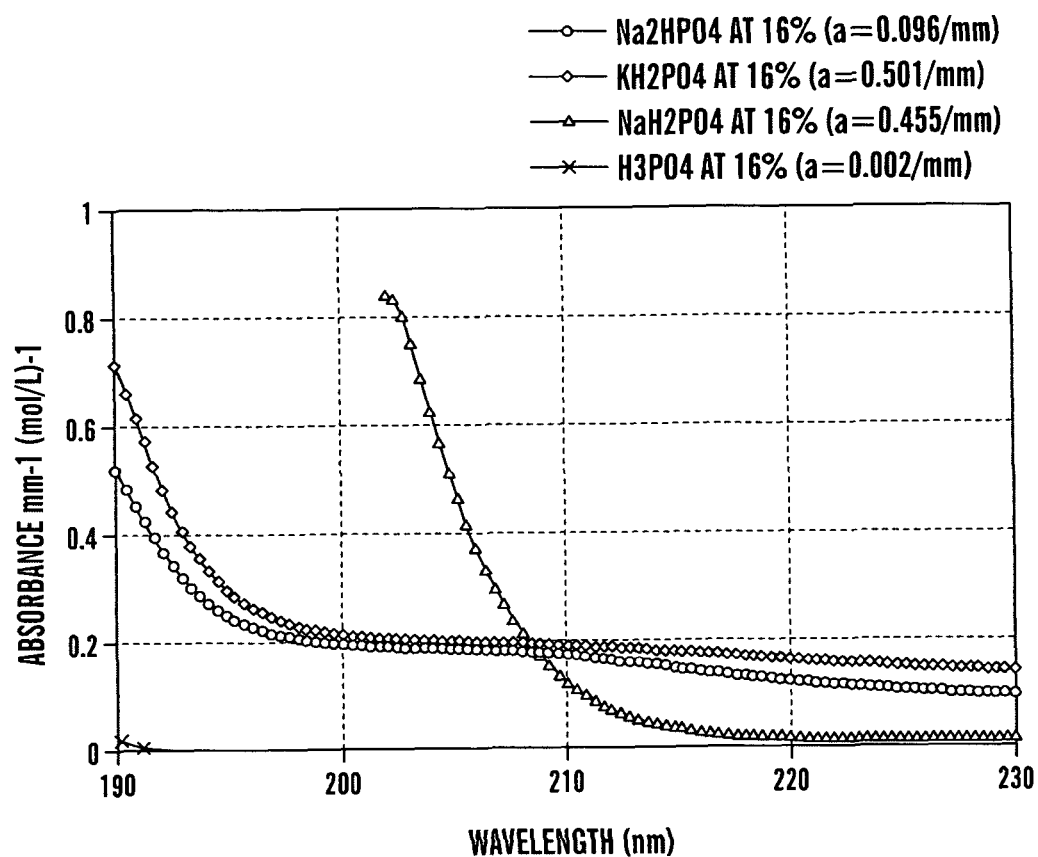
FIG. 6 is another graph of absorbance versus wavelength for another plurality of fluids.

The absorption of several families of materials dissolved in water to generate a fluid 26 have been measured. These materials include chlorides, iodides, fluorides, bromides, phosphates, and sulfates. By way of example, the absorption properties of sulfates and phosphates dissolved in water to generate a fluid 26 are illustrated in FIGS. 5 and 6, respectively. The molar absorbance (absorbance per mm per mol/liter) is given for each material along with the absorbance per mm for each particular sample measured. Samples were measured using a Perkin Elmer UV-vis spectrophotometer, model UV11, using quartz fluid sample holders in the path of the beam. For each sample, a pair of measurements were taken at 1 mm and 2 mm sample thicknesses for differential calculation of absorbance. Several of these materials show sufficiently low absorbance, in these embodiments below 0.8 mm per mol/liter, at wavelengths between about 180 nm and about 300 nm, although other thresholds for absorbance could be used. These additives dissolved in the water comprise phosphates and sulfates of hydrogen, cesium, sodium, and potassium and other rare earth (refractory metal) catons of the periodic table in groups 1A through VIIIA, although other additives could be used. A table illustrating the absorbance of a variety of fluids, each comprising water and one or more additives, at 193 nm and 248 nm is illustrated in FIG. 7.

Figure 8:
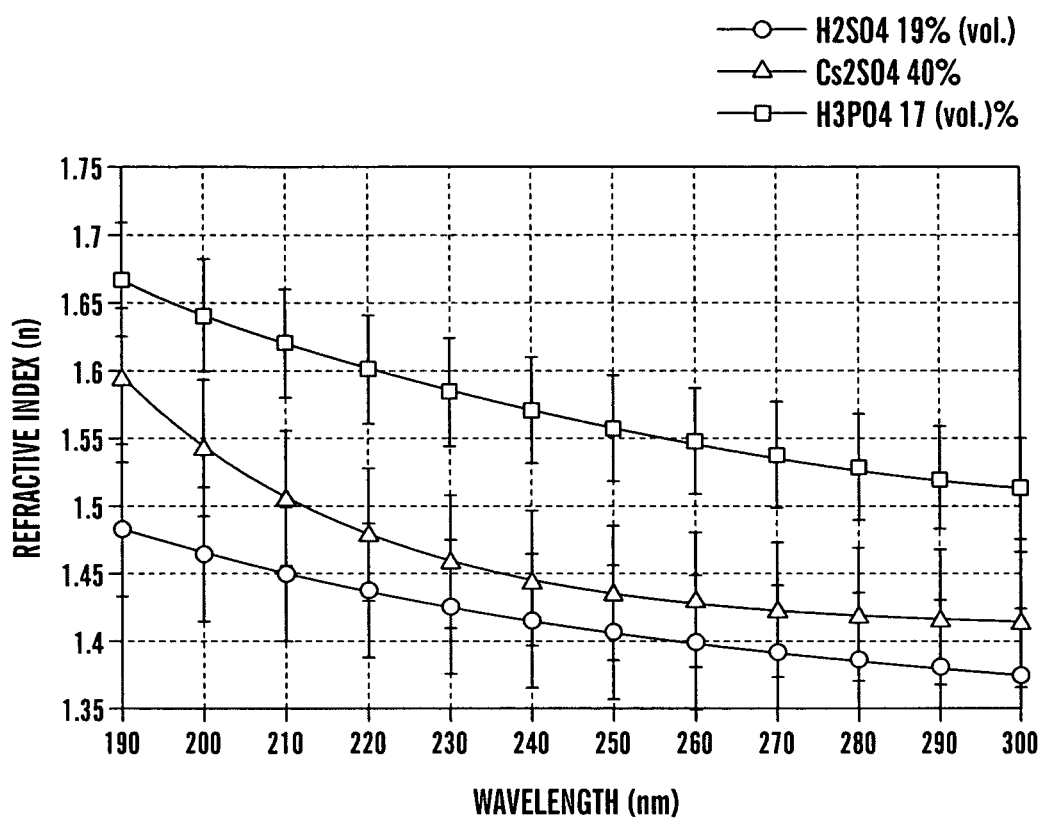
FIG. 8 is a graph of refractive index versus wavelength for a plurality of fluids.

Referring to FIG. 8, the refractive index of three examples of fluids 26 from FIGS. 5 and 6 are illustrated. In this example, the fluids 26 are cesium sulfate, hydrogen sulfate (sulfuric acid) and hydrogen phosphate (phosphoric acid). Each of these fluids show a refractive index value above that for pure water, while allowing large transmission through low absorption, in these embodiments below 0.8 mm per mol/liter. All refractive index measurements were taken using spectroscoptic variable angle ellipsometry using a Woollam WVASE tool (WVASE-DUV). For each sample, a film of photoresist 28 was created on a substrate 30 of fused silica which was made rough by bead blasting the front surface. This allowed a film of the fluid 26 to adhere to the photoresist 28 on the substrate 30 and allowed for ellipsometric fitting of refractive index using the data generated by the tool.

The refractive index values achieved with the three fluids at 193 nm are set forth in the table below. Each fluid 26 is identified by the concentration (by weight for CsSO4 or by volume for acids), refractive index at 193 nm, the maximum numerical aperture allowed (NAmax) at 193 nm, and the minimum resolution allowed at 193 nm (Rmin).

| Fluid | Refractive index | NAmax | Rmin |
|---|---|---|---|
| H2SO4 19% by volume | 1.48 | 1.48 | 32.6 nm |
| Cs2SO4 40% by weight | 1.60 | 1.60 | 30.2 nm |
| H3PO4 17% by volume | 1.63 | 1.63 | 29.6 nm |

The resulting Rmin for these examples of fluids is smaller than the 33.7 nm allowed with water alone which is a significant improvement. Another table with the refractive indices and Cauchy parameters for a plurality of different fluids 26 comprising water and one or more additives at 193 nm and 248 nm is illustrated in FIG. 9. As shown in this table, all of these fluids have a refractive index value which is above the refractive index value of water which is 1.436 at 193 nm and 1.379 at 248 nm.

Referring to FIG. 10, scanning electron micrographs of images created using water alone as an imaging media and a fluid 26 comprising water with 40 wt % of CsSO4. These images shows results for a thirty-one degree angular aperture (propagation angle) in each fluid. The corresponding numerical aperture in water is 0.70 while the corresponding numerical aperture in the fluid 26 comprising CsSO4 is 0.78. This demonstrates an 11% improvement in resolution of the imaging using the fluid which comprises an additive to the water. By way of example, H2SO4 would provide a 4% improvement and H3PO4 would provide for a 13% improvement.

Accordingly, the present invention provides for a method and system for customizing the refractive index of water from its natural value to values as large as those for a fully saturated solution of the additive compound. This allows for very precise control of the optical properties of the fluid 26 to match the specific design criteria of the optical lithography system 10. The present invention achieves refractive index values larger than those attainable with water for microlithography at wavelengths between 180 nm and 300 nm while keeping absorption at a level which can be tolerated in lithography.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefor, is not intended to limit the claimed processes to any order except as may be specified in the claims. Accordingly, the invention is limited only by the following claims and equivalents thereto.

What is claimed is:

1. A photolithographic exposure system for use on a photoresist on a substrate, the system comprising:
   an illumination system which provides a source of radiation;
   a photomask with one or more object patterns;
   a projection optical exposure system positioned to project an image of the one or more object patterns towards an image plane on the photoresist using the radiation from the illumination system; and
   a liquid with additive dispensing system that positions a liquid with at least one inorganic additive at a concentration of at least about 16% between the projection optical exposure system and the photoresist on the substrate, the liquid with the at least one additive has a refractive index value above a refractive index value of water and an absorbance below 0.8 per millimeter at wavelengths below about 300 nm.

2. The system as set forth in claim 1 wherein the refractive index value of the liquid with the at least one additive is above about 1.5.

3. The system as set forth in claim 1 wherein the liquid comprises water.

4. The system as set forth in claim 3 wherein the at least one additive comprises anions.

5. The system as set forth in claim 3 wherein the at least one additive comprises cations.

6. The system as set forth in claim 1 further comprising a mixing system configured to mix the liquid with the at least one additive to form the liquid, the mixing system fluidly connected to the liquid with additive dispensing system and further comprises an adjustable nozzle positioned adjacent at least one surface of a lens in the projection optical exposure system to position the liquid with the at least one additive.

7. The system as set forth in claim 1 further comprising a purification system that at least partially purifies the liquid, the purification system fluidly connected to the liquid with additive dispensing system.

8. The system as set forth in claim 1 wherein the refractive index value of the liquid is substantially the same as the refractive index of the photoresist.

9. The system as set forth in claim 1 wherein the at least one additive content is in the range from about 25 to 45 percent by weight.

10. A method comprising:
    removing at least one of one or more contaminants and one or more gasses from a liquid; and
    adding at least about 16% of at least one inorganic additive to the liquid to raise a refractive index of the liquid and the at least one inorganic additive to a first value-which is above a refractive index value for water, wherein the adding at least one additive to the liquid so that the liquid and the at least one additive has an absorbance below 0.8 per millimeter at wavelengths below about 300 nm.

11. The system as set forth in claim 1 wherein the liquid with the at least one additive has a refractive index value of at least about 1% percent above the refractive index value of water.

12. The system as set forth in claim 1 wherein the liquid with the at least one additive has an absorbance below 0.8 per millimeter at wavelengths between about 180 nm and 300 nm.

13. A method for photolithographic exposure comprising:
placing a liquid with at least about 16% of at least one inorganic additive on a photoresist on a substrate, the liquid with the at least one additive has a refractive index value above a refractive index value of water and an absorbance below 0.8 per millimeter at wavelengths below about 300 nm; and
directing illumination through a photomask with one or more object patterns to project the one or more object patterns on the photoresist.

14. The method as set forth in claim 13 wherein the refractive index value of the liquid with the one or more additives is above about 1.5.

15. The method as set forth in claim 13 wherein the liquid comprises water.

16. The method as set forth in claim 15 wherein the at least one additive comprises anions.

17. The method as set forth in claim 15 wherein the at least one additive comprises cations.

18. The method as set forth in claim 13 further comprising:
mixing the liquid with at least one additives in a mixing system, and
positioning an adjustable nozzle of the mixing system adjacent at least one surface of a lens in a projection optical exposure system to position the liquid with the at least one additive.

19. The method as set forth in claim 18 further comprising at least partially purifying the liquid.

20. The method as set forth in claim 13 wherein the refractive index value of the liquid is substantially the same as the refractive index of the photoresist.

21. The method as set forth in claim 13 wherein the at least one additive content is in the range from about 25 to 45 percent by weight.

22. The method as set forth in claim 13 wherein the liquid with the at least one additive has a refractive index value of at least about 1% above the refractive index value of water.

23. The method as set forth in claim 13 wherein the liquid with the at least one additive has an absorbance below 0.8 per millimeter at wavelengths between about 180 nm and 300 nm.

24. A system for making an immersion fluid for lithography, the system comprising:
a water purification system to remove at least one of one or more contaminants and one or more gasses from a liquid; and
an injection system which adds at least about 16% of at least one inorganic additive to the liquid to raise a refractive index of the liquid and the at least one additive to a first value which is above a refractive index value for water, wherein the injection system adds the at least one additive to the liquid so that the liquid with the at least one additive has an absorbance below 0.8 per millimeter at wavelengths below about 300 nm.

25. The system as set forth in claim 24 wherein the first value is above 1.5.

26. The system as set forth in claim 24 wherein the liquid comprises water.

27. The system as set forth in claim 26 wherein the at least one additive comprises anions.

28. The system as set forth in claim 26 wherein the at least one additive comprises cations.

29. The system as set forth in claim 24 wherein the purification system removes one or more contaminants and one or more gases.

30. The system as set forth in claim 24 wherein the at least one additive content is in the range from about 25 to 45 percent by weight.

31. The system as set forth in claim 24 wherein first value is at least about 1% percent above the refractive index value of water.

32. The system as set forth in claim 24 wherein the liquid with the at least one additive has an absorbance below 0.8 per millimeter at wavelengths between about 180 nm and 300 nm.

33. The method as set forth in claim 10 wherein the at least one additive content is in the range from about 25 to 45 percent by weight.

34. The method as set forth in claim 10 wherein the first value is above 1.5.

35. The method as set forth in claim 10 wherein the liquid comprises water.

36. The method as set forth in claim 35 wherein the at least one additive comprises anions.

37. The method as set forth in claim 35 wherein the at least one additive comprises cations.

38. The method as set forth in claim 10 wherein the removing at least one of one or more contaminants and one or more gasses from the liquid further comprises removing one or more contaminants and one or more gases.

39. The method of claim 10 wherein first value is at least about 1% percent above the refractive index value of water.

40. The method as set forth in claim 10 wherein the liquid and the at least one additive has an absorbance below 0.8 per millimeter at wavelengths between about 180 nm and 300 nm.

* * * * *